United States Patent
Ju et al.

(10) Patent No.: US 8,791,492 B2
(45) Date of Patent: Jul. 29, 2014

(54) SEMICONDUCTOR LASER CHIP PACKAGE WITH ENCAPSULATED RECESS MOLDED ON SUBSTRATE AND METHOD FOR FORMING SAME

(75) Inventors: Jin Han Ju, Kirkland (CA); Robert Burman, Vaudreuil-Dorion (CA); Jerry Deleon, Calamba (PH)

(73) Assignee: Excelitas Canada, Inc., Vaudreuil-Dorion (CA)

( * ) Notice: Subject to any disclaimer, the term of this patent is extended or adjusted under 35 U.S.C. 154(b) by 130 days.

(21) Appl. No.: 13/411,275

(22) Filed: Mar. 2, 2012

(65) Prior Publication Data

US 2012/0213239 A1   Aug. 23, 2012

Related U.S. Application Data

(63) Continuation-in-part of application No. 12/572,074, filed on Oct. 1, 2009, now Pat. No. 8,431,951.

(51) Int. Cl.
*H01L 33/00* (2010.01)

(52) U.S. Cl.
USPC .............. 257/99; 257/676; 257/700; 257/711

(58) Field of Classification Search
USPC ........................................ 372/44.01; 257/711
See application file for complete search history.

(56) References Cited

U.S. PATENT DOCUMENTS

| | | | |
|---|---|---|---|
| 5,035,483 A | 7/1991 | Waitl et al. | |
| 5,627,851 A | 5/1997 | Takahashi | |
| 6,571,466 B1 | 6/2003 | Glenn et al. | |
| 6,753,600 B1 | 6/2004 | Ho | |
| 7,391,102 B2 * | 6/2008 | Komoto et al. | 257/676 |
| 7,567,602 B2 * | 7/2009 | Tsuji | 372/44.01 |
| 2004/0233950 A1 | 11/2004 | Furukawa | |
| 2005/0248008 A1 | 11/2005 | Wilson et al. | |
| 2008/0006837 A1 | 1/2008 | Park et al. | |
| 2009/0230420 A1 | 9/2009 | Bogner et al. | |
| 2011/0079801 A1 | 4/2011 | Zhang | |

FOREIGN PATENT DOCUMENTS

| | | |
|---|---|---|
| EP | 1876653 A2 | 1/2008 |
| JP | 52091666 | 8/1977 |
| JP | S59193083 A | 11/1984 |
| JP | S61272987 A | 12/1986 |
| JP | H05114751 A | 5/1993 |

(Continued)

OTHER PUBLICATIONS

International Search Report and Written Opinion received for PCT Patent Application No. PCT/GB2010/001825, mailed Jan. 12, 2011, 10 pages.

*Primary Examiner* — Thien F Tran
(74) *Attorney, Agent, or Firm* — Peter A. Nieves; Sheehan Phinney Bass + Green PA (57) ABSTRACT

A laminate leadless carrier package having a semiconductor chip mounted at the edge of a recess region in a substrate supporting the chip, the substrate having a plurality of conductive and dielectric layers, a wire bond coupled to the optoelectronic chip and a wire bond pad positioned on the top surface of the substrate. An encapsulation covers the laser chip, the wire bond, and at least a portion of the top surface of the substrate including the recess region. The encapsulation is an optically transparent molding compound. The package is arranged to be mounted as a side-looker and/or a top-looker.

8 Claims, 5 Drawing Sheets

(56) References Cited

FOREIGN PATENT DOCUMENTS

| | | |
|---|---|---|
| JP | 2000174350 A | 6/2000 |
| JP | 2001077408 A | 3/2001 |
| JP | 2002072021 A | 3/2002 |
| JP | 2006147985 A | 6/2006 |
| JP | 2000277808 A | 10/2006 |
| JP | 2009176835 A | 8/2009 |
| WO | 96/00918 A1 | 1/1996 |

* cited by examiner

SEMICONDUCTOR LASER CHIP PACKAGE WITH ENCAPSULATED RECESS MOLDED ON SUBSTRATE AND METHOD FOR FORMING SAME

CROSS-REFERENCE TO RELATED APPLICATIONS

The present application is a continuation-in-part, and claims priority to, copending U.S. patent application Ser. No. 12/572,074, filed Oct. 1, 2009, and having the title "OPTO-ELECTRONIC DEVICES WITH LAMINATE LEADLESS CARRIER PACKAGING IN SIDE-LOOKER OR TOP-LOOKER DEVICE ORIENTATION," which is incorporated herein by reference in its entirety.

FIELD OF THE INVENTION

The present invention relates to circuit components, and more particularly, is related to a semiconductor laser chip.

BACKGROUND OF THE INVENTION

Surface mount technology (SMT) is used for constructing electronic circuits where the components (surface-mounted components/SMCs) are mounted directly onto the surface of printed circuit boards (PCBs). An electronic device so made is called a surface mount device (SMD). SMT has largely replaced the through-hole technology construction method of fitting components with wire leads into holes in the circuit board.

An SMT component is usually smaller than its through-hole counterpart because it has either smaller leads or no leads at all. It may have short pins or leads of various styles, flat contacts, a matrix of solder balls (BGAs), or terminations on the body of the component.

Edge emitting lasers have beams that widen very fast in a direction normal to the mounting surface. Edge emitting lasers can be mounted in packages with leads that orient the laser perpendicular to the main driver board. The package must have a window cap or encapsulation to protect the laser which is placed at the edge of the lead frame or pedestal of the package base. When mounted on a large, flat surface, such as directly on the main driver board or on a secondary substrate which could be a PCB, ceramic or other substrate that is then mounted on the main driver board, at least a portion of the beam may intersect the surface. To overcome this limitation, edge emitting lasers are often mounted at the edge of a driver board or secondary substrate, where the edge of the laser is adjacent to or nearly adjacent to the edge of the board or substrate so the beam widens in an area beyond the board or substrate. Such an arrangement has several disadvantages. For example, the facet of a laser is typically sensitive to contamination and humidity, among other sensitivities, and the proximity to the edge of the board or substrate may increase the vulnerability of the facet. In addition, the necessity of locating the laser at the edge of a board or substrate limits the flexibility of board design, and may make certain packaging options impractical, for example, certain chip carriers, such as a laminate leadless carrier (LLC). A laminate leadless carrier uses flat metal pads that make contact with a printed circuit board. There are no pins extending out of the package and it may be mounted on the printed circuit board directly. A laminate leadless carrier includes multiple layers of conductive and dielectric layers laminated together.

While SMT provides advantages in manufacturing and circuit layout, the limitations of semiconductor edge emitting laser chips have provided a challenge to SMT lasers. Besides the logistical problems related to positioning a semiconductor laser chip at the edge of a surface mount package, thermal dissipation considerations may conflict with surface mount features. In particular, SMT generally makes it difficult to conduct heat generated by a semiconductor laser chip to the surface of the package, where it may be further dissipated, for example using heat sinks or convection methods.

Therefore, there is a need in the industry to overcome some or all of the above shortcomings.

SUMMARY OF THE INVENTION

Embodiments of the present invention provide a semiconductor laser molded on a substrate and a method for manufacturing the same. Briefly described, the present invention is directed to a laminate leadless carrier package. The package includes a semiconductor laser chip, and a substrate supporting the semiconductor laser chip. The substrate has a plurality of conductive and dielectric layers laminated together, and an edge recess region disposed inset into an edge of the substrate, wherein the semiconductor laser chip is mounted adjacent to the edge recess region. The package further includes a wire bond pad positioned on the top surface of the substrate, a wire bond coupled to the semiconductor laser chip and the wire bond pad, and an encapsulation covering the semiconductor laser chip, the edge recess region, the wire bond, and at least a portion of the top surface of the substrate, wherein the encapsulation is a molding compound.

The semiconductor laser chip may be an edge emitting laser. The laminate leadless carrier package may be arranged to be mounted in a side-looker configuration on a printed circuit board, wherein the active area of the semiconductor laser chip is perpendicular to the printed circuit board, or the laminate leadless carrier package may be arranged to be mounted in a top-looker configuration on a printed circuit board, wherein the active area of the semiconductor laser chip is parallel to the printed circuit board. The plurality of conductive and dielectric layers may include a bottom conductive layer, a top conductive layer, and a dielectric layer between the top and bottom conductive layers. The package may further include a plurality of conductive vias providing electrical connections and thermal conduits between the top conductive layer and the bottom conductive layer. The molding compound is optically transparent.

Briefly described in architecture, a second aspect of the present invention is directed to a laminate leadless carrier package including a semiconductor laser chip, and a substrate supporting the semiconductor laser chip. The substrate has a plurality of conductive and dielectric layers laminated together, and an edge recess region disposed within a recess in an edge of the substrate, wherein the semiconductor laser chip is mounted adjacent to the edge recess region. The package includes a wire bond pad positioned on the top surface of the substrate, a wire bond coupled to the optoelectronic chip and the wire bond pad, and an encapsulation covering the optoelectronic chip, the wire bond, and at least a portion of the top surface of the substrate. The encapsulation is a molding compound. The laminate leadless carrier package is arranged to be mounted in a configuration from the group consisting of a side-looker configuration on a printed circuit board, wherein the active area of the optoelectronic chip is perpendicular to the printed circuit board, and a top-looker configuration on a printed circuit board, wherein the active area of the optoelectronic chip is parallel to the printed circuit board.

Briefly described, a third aspect of the present invention is directed to a method for manufacturing a plurality of laminate leadless semiconductor laser carrier packages. The method includes the steps of preparing a substrate, wherein preparing the substrate includes forming a plurality of recess regions in the substrate, laminating a top conductive layer, a bottom conductive layer, and a dielectric layer between the top and bottom conductive layers together, and wherein the top conductive layer includes a die attach pad, a wire bond pad, and two slotted vias. Other steps include applying epoxy adhesive to the die attach pad, mounting a semiconductor laser chip on the die attach pad, wire-bonding the semiconductor laser chip with the wire bond pad using a wire bond, molding a molding compound to form an encapsulation filling the plurality of recess regions and covering the optoelectronic chip, the wire bond, and at least a portion of the top surface of the substrate, and dicing the substrate into individual laminate leadless carrier packages.

The third aspect may further include preparing a plurality of conductive vias providing electrical connections and thermal conduits between the top conductive layer and the bottom conductive layer. The third aspect may also include the step of polishing the molding compound filling the plurality of recess regions. The plurality of recess regions may be arranged in at least one row, and the polishing may be performed while the plurality of recess regions are arranged in rows before completing the dicing.

Other systems, methods and features of the present invention will be or become apparent to one having ordinary skill in the art upon examining the following drawings and detailed description. It is intended that all such additional systems, methods, and features be included in this description, be within the scope of the present invention and protected by the accompanying claims.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principals of the invention.

DETAILED DESCRIPTION

Reference will now be made in detail to embodiments of the present invention, examples of which are illustrated in the accompanying drawings. Wherever possible, the same reference numbers are used in the drawings and the description to refer to the same or like parts.

Exemplary embodiments for an apparatus and a method for manufacturing a semiconductor laser package are presented. A laser chip is mounted adjacent to a recess region inset from an edge of a substrate. The laser chip is oriented so the laser chip facet overlooks the recess region. A plurality of conductive vias provide electrical connections and/or thermal conduits between a top conductive layer and a bottom conductive layer upon the substrate. An over molding optical epoxy compound encapsulates at least a portion of the top surface of the substrate, the laser chip and the recess region. The semiconductor laser package may be mounted upon a printed circuit board so that the laser beam is parallel to the printed circuit board, or so the laser beam is perpendicular to the printed circuit board.

Figure 1:
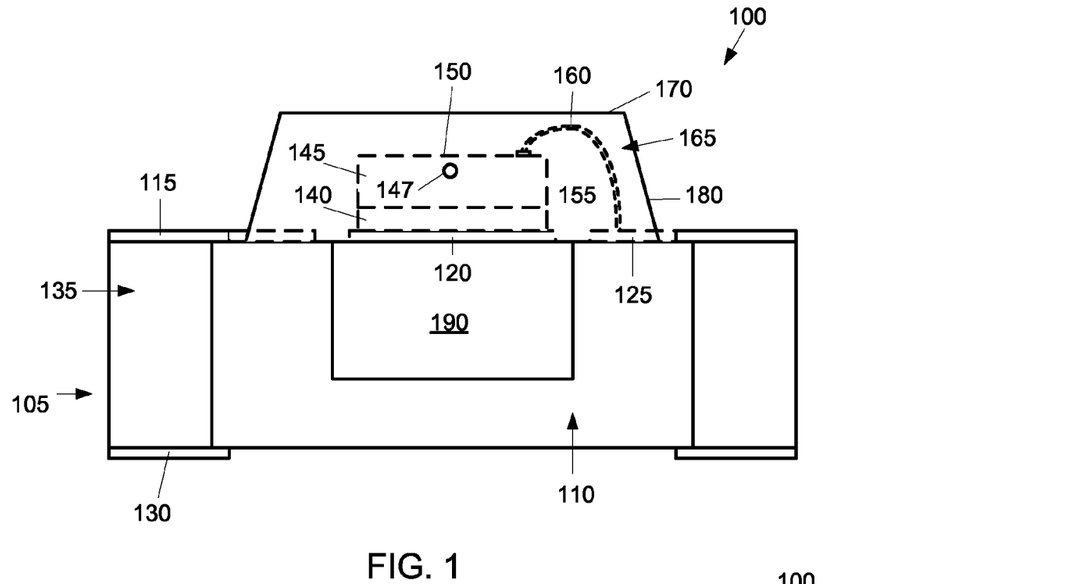
FIG. 1 is a schematic diagram of an exemplary semiconductor laser package in accordance with the present invention.

FIG. 1 illustrates a cross-sectional view of an exemplary embodiment of a semiconductor laser package 100 in accordance with the present invention. The semiconductor laser package 100 includes a substrate 105, a chip 145, and an encapsulation 165.

The chip 145 may be any laser device, including edge emitting lasers, and the like. For example, the chip 145 may be a laser chip formed of any appropriate material, such as group IV (silicon) semiconductors and group III-V semiconductors. The laser chip 145 may have any structure, such as an epitaxial wafer (EPI) or a reach-through structure.

The semiconductor laser package 100 may be a laminate leadless carrier (LLC). A leadless carrier uses flat metal pads that make contact with a printed circuit board. There are no pins extending out of the package and it may be mounted directly on the printed circuit board. The laminate chip carrier includes multiple layers of conductive and dielectric layers laminated together. In one example, the laminate leadless carrier includes a top conductive layer and a bottom conductive layer with a dielectric layer between, as described in greater detail below. Depending on the complexity of the design, the laminate chip carrier may have many different conductive and/or dielectric layers.

The semiconductor laser package 100 includes the substrate 105 for supporting the chip 145. The substrate 105 may be, but is not limited to, any thin film ceramic substrates, thick film ceramic substrates, and different kinds of printed circuit boards (PCBs). In one preferred embodiment, the semiconductor laser package 100 does not include any lead-frame. The substrate 105 may include a dielectric layer 110, a top conductive layer 115 and a bottom conductive layer 130 which are provided above and below the dielectric layer 110 respectively, and a plurality of conductive vias 135 providing electrical connections and/or thermal conduits between the top and bottom conductive layers 115 and 130. The conductive vias 135 may be employed in either the top-looker or the side-looker device orientation (the two orientations will be described in greater detail below). The conductive vias 135 may serve as a conduit for electricity and/or thermal transfer. Such thermal transfer is important to disperse the heat generated by a laser chip that could otherwise prove detrimental to chip performance and reliability.

The top conductive layer 115 includes a die attach pad 120 for attaching chip 145 onto the substrate 105. In particular, a layer of adhesive 140 may be used to attach chip 145 onto the die attach pad 120 above the substrate 105. The top conductive layer 115 also includes a wire bond pad 125 for attaching a wire bond 160, which provides an electrical connection between the chip 145 and the top conductive layer 115. While a single wire bond 160 is used in this embodiment, there is no objection to using two or more wire bonds as appropriate in alternative embodiments. Each conductive via 135 may be a small opening in different slot shapes, such as a small round opening.

Figure 2:
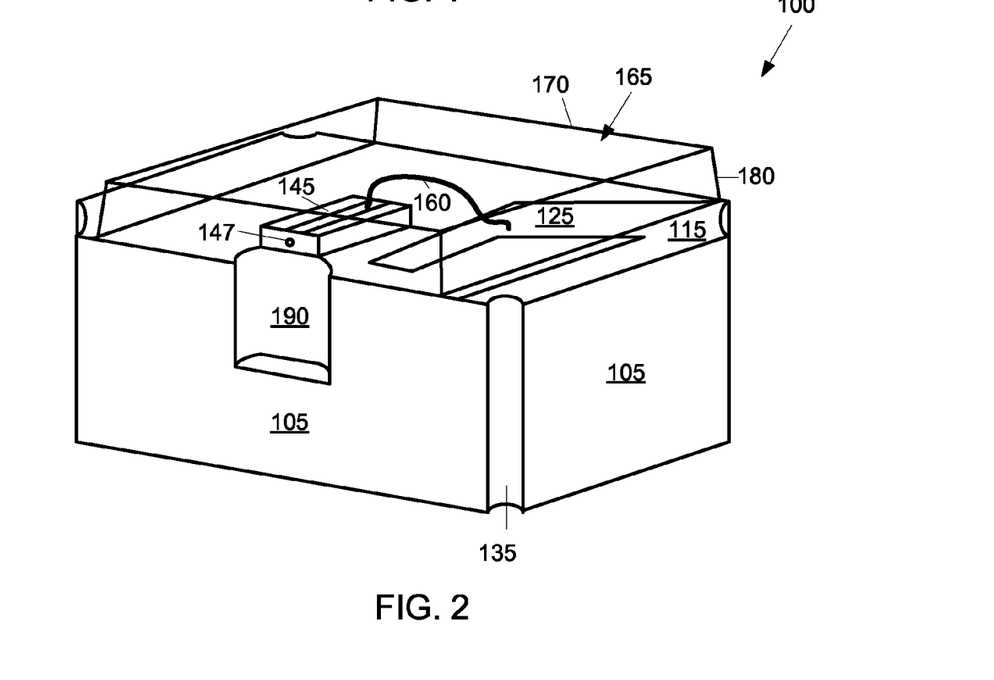
FIG. 2 is a schematic diagram of a perspective view of an exemplary semiconductor laser package.

The substrate 105 has a recess region 190, as shown by FIG. 2, where the substrate material is removed to form a pull-back area at the edge of the substrate 105. The chip 145 is preferably mounted so the laser emitting edge of the chip 145 is adjacent or nearly adjacent to the recess region 190, as shown by FIG. 2. Positioning the chip 145 at the edge of the recess region allows a light beam 310 (FIG. 3) to project outward from the chip 145 without intersecting with the substrate 105. Similarly, the recess region 190 is formed so a full beam of light may be outputted from a laser chip 145 facet without substrate reflections that can distort the light beam profile. The recess region 190 allows for positioning of the laser chip 145 at a location inset from the edge of the package 100 without the light beam 310 (FIG. 3) intersecting the substrate 105.

The encapsulation 165 is provided to encapsulate and protect the chip 145, the wire bond 160, the recess region 190, and the substrate 105 or portions of the substrate 105. In one exemplary embodiment, the encapsulation 165 is used to encapsulate an edge emitting laser chip. Since edge emitting laser chips typically operate at high voltages, the encapsulation 165 may be a molding compound having low ionic content and high moisture resistance. The encapsulation may be, for example, an optical epoxy compound. In some exemplary embodiments, the encapsulation 165 may be a molding compound that provides protection to the chip 145 and the wire bond 160 without putting high stress to the wire bond 160. In some exemplary embodiments, the molding compound may be optically transparent so that it does not filter or attenuate light at particular wavelengths. For example, APTEK 6100-1 A/B may be used as the molding compound. APTEK 6100-1 A/B is a two component, unfilled, water clear, rigid system designed for the encapsulation of LED chips in optoelectronic packages. It provides environmental protection and when casted may serve as the lens portion of the device, displaying excellent clarity and light transmissivity.

The encapsulation 165 is shown in FIG. 1 to cover only a portion of the top surface of the substrate 105, but the encapsulation 165 may cover the entire top surface of the substrate 105 as may be required by the end application. The side surface 180 of the encapsulation 165 may be vertical, slanted, or slanted at different angles in different sections of the encapsulation. The top surface 170 (optical interface) of the encapsulation 165 may be molded as a flat surface or as a cylindrical, spherical, aspherical, dome-shaped, torroidal lens, and the like.

An advantage of having the edge of the laser chip 145 within the encapsulation 165 is protection of the active area or facet 147 in the laser chip 145 for example, during assembly or handling of parts after manufacturing and before assembly on a PCB. If the chip 145 is mounted at the edge of a substrate 105 with no recess region 190, the facet 147 of the laser chip 145 would not be protected by the encapsulation 165.

Figure 3:
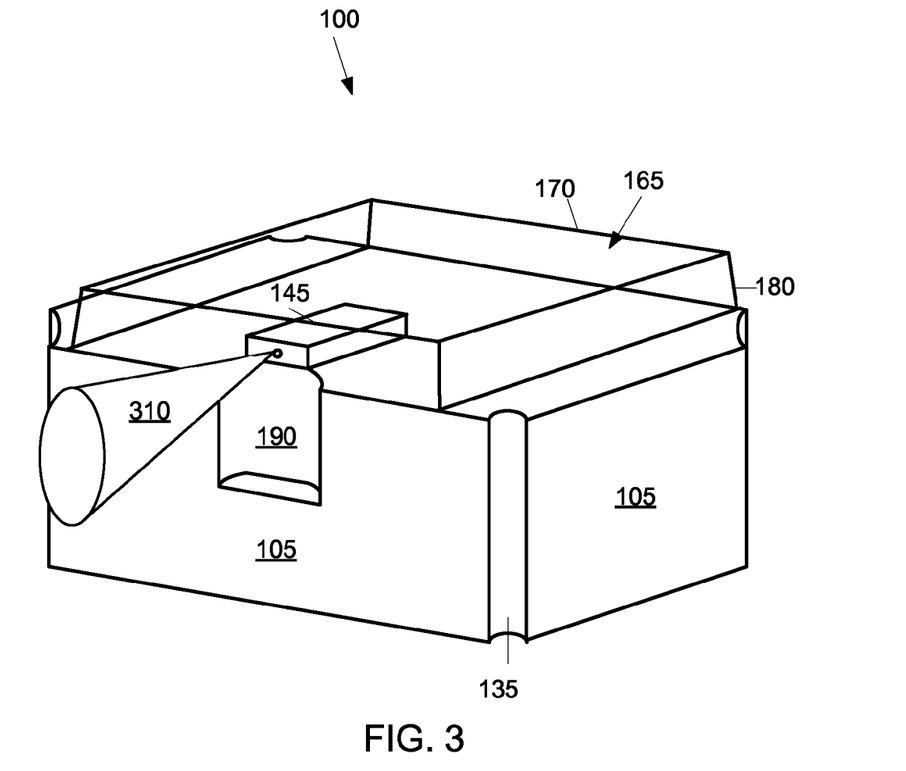
FIG. 3 is a schematic diagram of a perspective view of an exemplary semiconductor laser package indicating the path of the laser beam.

FIG. 3 is a simplified illustration of the semiconductor laser package 100 showing the projection of the laser beam 310 from the chip 145 within the semiconductor laser package 100. The beam 310 widens quickly at a divergence angle in the direction it is projected. If the recess 190 was not present, and if the area where the recess 190 is located was instead filled with substrate material, the beam 310 would intersect with the substrate 105. Such an intersection is problematic for several reasons. First, the intersection obstructs the path of the beam 310, absorbing a portion of the energy intended to be transmitted. Second, the substrate 105 would be heated by the energy absorbed from the beam 310. Third, the intersection area could reflect a portion of the beam, causing undesired consequences.

The recess region 190 may be sized so the chip 145 is positioned adjacent or nearly adjacent to the recess region 190. The recess region 190 may have various widths and depths as required by the end application. For example, an application where the beam disperses widely may have a deeper recess area 190 than an application where the beam has a more narrow dispersion. While the recess area 190 in this embodiment is depicted as being rectangular, there is no objection to other shapes for a recess area 190, for example, a semicircle, triangular wedge, or other shapes. The recess region 190 intersects the top surface of the substrate 105, and may not extend to intersect the bottom surface of the substrate 105, as shown in FIG. 3. However, there is no objection to embodiments of the semiconductor laser package 100 where the recess region 190 extends to the bottom surface of the substrate 105.

Figure 4:
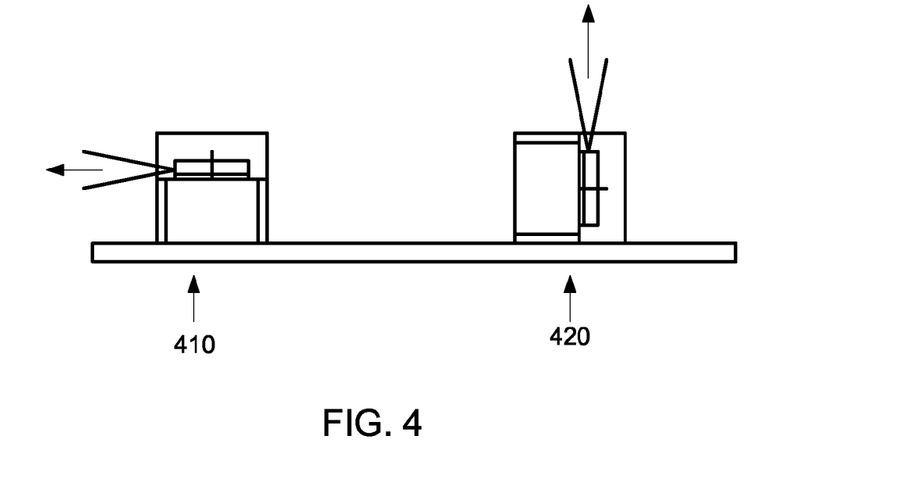
FIG. 4 illustrates an exemplary semiconductor laser package mounted as a side-looker or a top-looker on a printed circuit board.

As shown in FIG. 4, the semiconductor laser package 100 may be mounted on a printed circuit board as a side-looker 410 or a top-looker 420. In general, the orientation may be selected based on the direction of light or emitting from the active area of the laser chip relative to the printed circuit board surface. For example, if the emitting from the active area of a laser is perpendicular to the printed circuit board, then a top-looker configuration 420 may be used. In this configuration, the active area of the laser chip is perpendicular to the printed circuit board. Conversely, if the light is parallel to the printed circuit board, then a side-looker configuration 410 may be used. In this configuration, the active area of the optoelectronic chip is parallel to the printed circuit board.

While the exemplary embodiment depicted in FIG. 2 has a single chip 145 and a single recess region 190, there is no objection to alternative embodiments having two or more chips 145. Two or more chips 145 may be aligned to project parallel beams, for example, and share a single recess area 190, or there may be multiple recess regions 190 along a single edge of the substrate 105. Similarly, the semiconductor laser package 100 may have recess regions 190 along two or more edges of the substrate 105 to accommodate multiple chips 145 projecting beams 310 oriented in different directions. It should be recognized that in some embodiments, more than one laser chip, wire bond, or die bond pad may be placed in a single semiconductor laser package.

Thermal Considerations

The substrate design considers a variety of thermally conductive materials. In addition, the vias 135 provide thermal conduits to conduct heat generated by the laser chip 145 to the edges of the surface mount package, where it may then be dispersed away from the semiconductor laser packages by methods familiar to persons having ordinary skill in the art. For example, vias 135 made of copper may have thermal conduction properties to reduce the thermal impedance from the laser chip to the final PCA.

It may be advantageous to ensure that the mounting board is maintained below a threshold temperature, for example, 25° C. Maintaining the temperature below the threshold temperature may be aided, for example, by the thermal properties of a conductive adhesive attaching the chip 145 to the substrate 105. The conductive adhesive 140, may be, for example, conductive epoxy or solder.

Method

Figure 5:
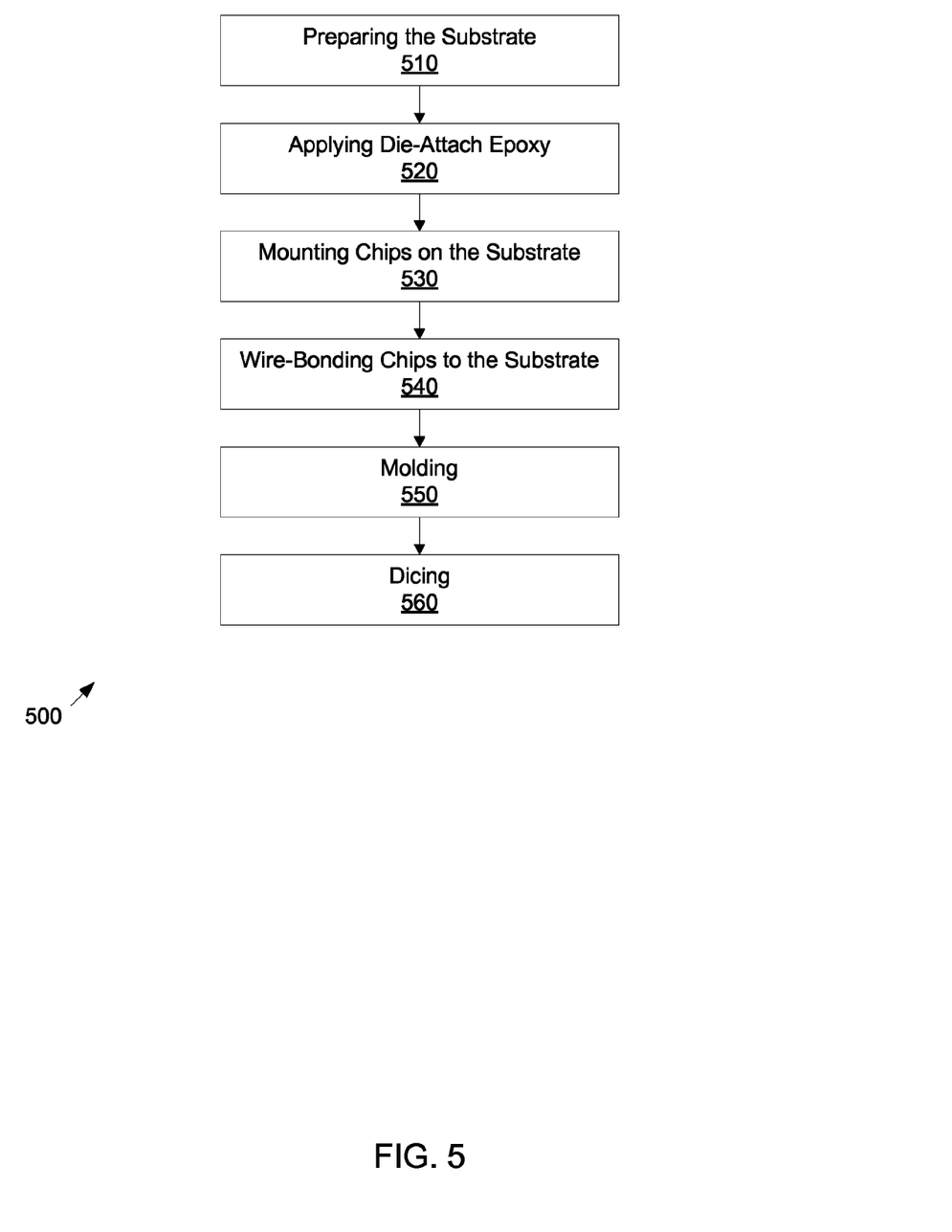
FIG. 5 is a flow chart of an exemplary matrix assembly process for manufacturing the semiconductor laser packages described in the present application.

FIG. 5 is a flow chart of an exemplary embodiment of a matrix assembly process 500 for manufacturing the semiconductor laser packages described in the present application. It should be noted that any process descriptions or blocks in flow charts should be understood as representing modules, segments, portions of code, or steps that include one or more instructions for implementing specific logical functions in the process, and alternative implementations are included within the scope of the present invention in which functions may be executed out of order from that shown or discussed, including substantially concurrently or in reverse order, depending on the functionality involved, as would be understood by those reasonably skilled in the art of the present invention.

The matrix assembly process is designed to meet the market demand for low cost, high volume, miniaturized, and SMT compatible products. As shown by block 510, the substrate is prepared by methods known in the art, including forming the recess regions into the substrate. Recess regions may be formed by etching the substrate, for example, wet or dry etching, by laser ablation, or by other method familiar to persons having ordinary skill in the art. The substrate can be, but is not limited to, a thin film ceramic substrate, a thick film ceramic substrate, and any kind of printed circuit board. The substrate material should have suitable thermal properties, for example, having a thermal resistance range of approximately 10 W/° C./m to 100 W/° C./m. As shown by block 520, die-attach epoxy is applied. The epoxy adhesive may be applied with dispensing, stamping, or printing approaches. It should be noted that other electrically and thermally conductive media, for example, solder, may be substituted for the die-attach epoxy.

As shown by block 530, laser chips mounted on the substrate manually or using a semi-automatic or automatic die-attach machine. As shown by block 540, wire bonds are added to the substrate manually or using a semi-automatic or automatic die-attach machine. Depending on the application, the wire-bond may use different materials, such as Alumina or Gold; different sizes, such as 0.7 mils and 1 mils in diameter; or different configurations such as ball-wedge and wedge-wedge. As shown by block 550, molding compounds are added to the substrate as an encapsulation through molding. The molding compound may be poured as a liquid and then cured. The curing temperature and time depend on the molding materials, and the information can be typically obtained from the material data sheets. As shown by block 560, the substrate is diced into individual semiconductor laser packages. The dicing may be, for example, done with a saw blade or laser beam.

Figure 6A:
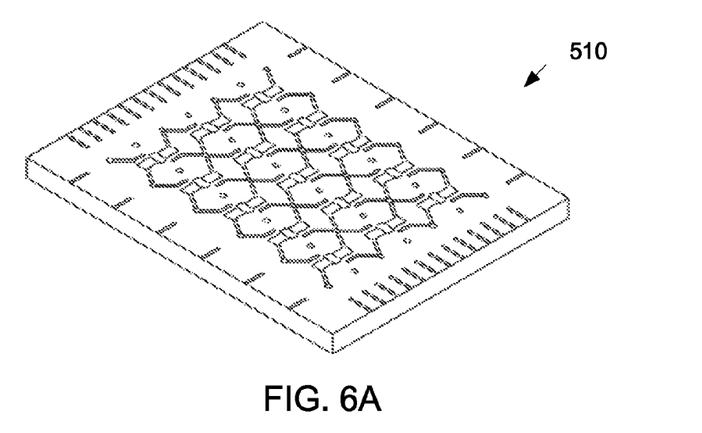
FIGS. 6A-6F illustrate a piece of substrate during different stages of the exemplary matrix assembly process.
Figure 6B:
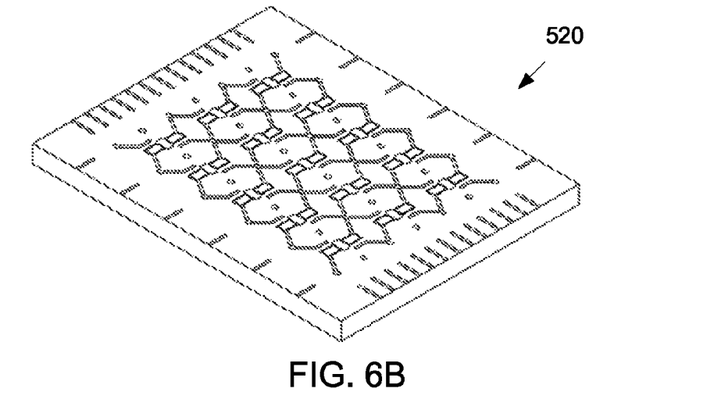
Figure 6C:
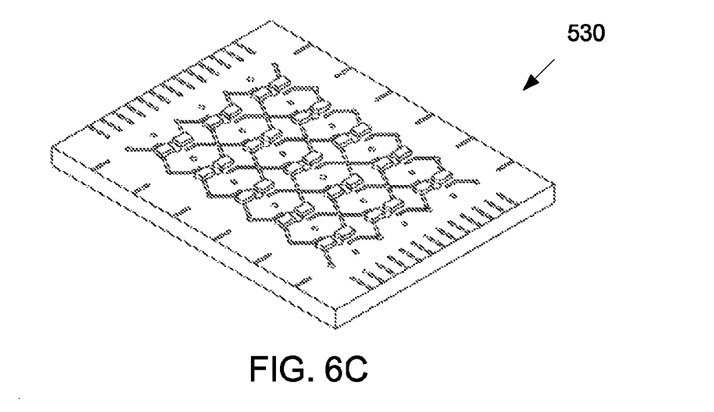
Figure 6D:
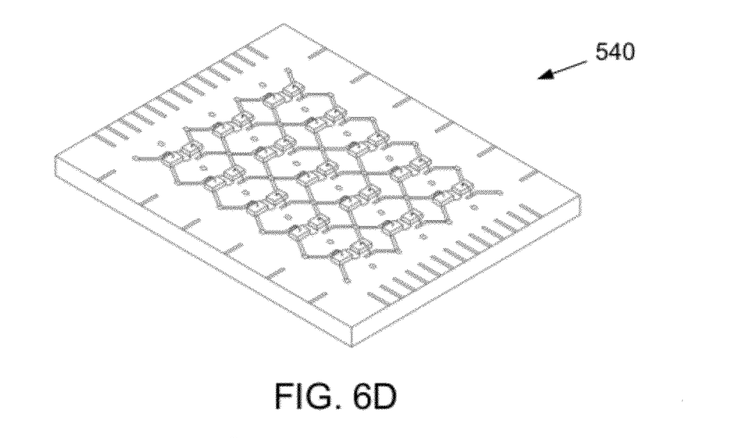
Figure 6E:
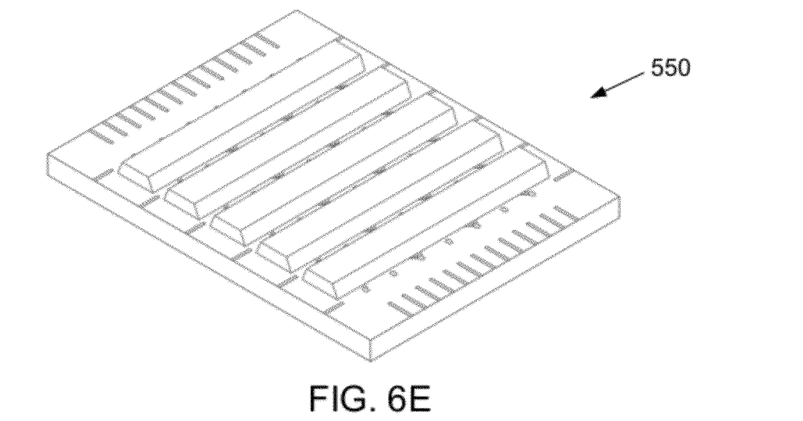
Figure 6F:
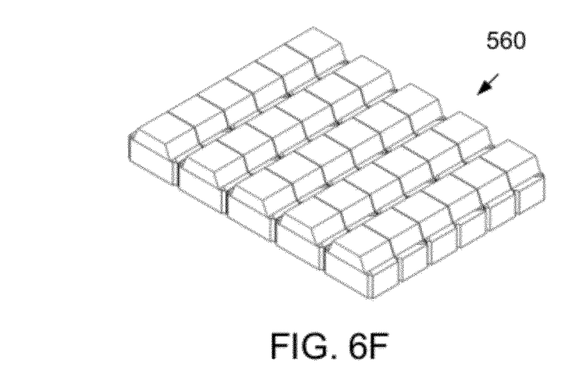
Figure 6G:
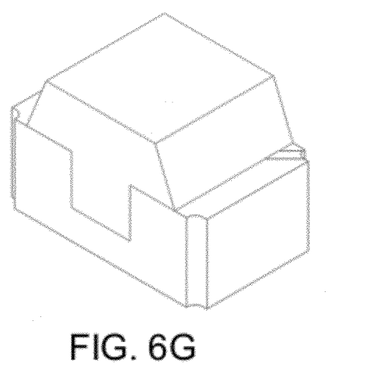
FIG. 6G illustrates an individual optoelectronic package which is the product of the exemplary matrix assembly process of FIG. 5.

FIGS. 6A-6F illustrate a piece of substrate during different stages of the exemplary matrix assembly process 500 described above, and FIG. 6G illustrates an individual semiconductor laser package resulted from the exemplary matrix assembly process. FIG. 6A illustrates a piece of substrate after it is prepared, including forming the recess regions. However, there is no objection to forming the recess regions before or after the rest of the substrate is prepared. FIG. 6B illustrates the assembly after the die-attach epoxy is applied. FIG. 6C illustrates the assembly after laser chips are mounted on the substrate. FIG. 6D illustrates the assembly after wire bonds are added to the substrate. FIG. 6E illustrates the assembly after molding compounds are added to the substrate as an encapsulation. FIG. 6F illustrates the assembly after it is diced into individual semiconductor laser packages. An assembly is the integration of more than one material; it can be one package or an array of packages.

It should be recognized that process 500 can be preceded by any number of processes performed as part of an assembly process. For example, in one preceding process, the substrate may be processed with cavities and/or embosses for the chips to sit on. Also, any number of processes may be performed subsequent to process 500 as part of the assembly process. For example, in one subsequent process, the diced devices may be tested in matrix form or individually.

It should be recognized that the process 500 may include additional steps and/or substeps. For example, polishing of the front face of the encapsulant where the light emerges from the LLC may occur after the dicing has begun, as shown in FIG. 6F, but before the dicing has been completed. For example, the polishing may occur when the front face of multiple recess regions are arranged in rows or strips, so that the encapsulant covering multiple recess regions in one strip may be polished at the same time before final dicing. This may be more efficient than polishing the encapsulant over each recess region individually after final dicing.

In summary, exemplary embodiments for an apparatus and a method of manufacturing a semiconductor laser package have been presented. An LLC SMD semiconductor laser provides a smaller footprint, better mechanical alignment of the optical components, lower cost through component array assembly process, and flexibility in orientation of the laser optical axis. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A laminate leadless carrier package, comprising:
   a semiconductor laser chip;
   a substrate supporting the semiconductor laser chip, the substrate comprising a plurality of conductive and dielectric layers laminated together, and an edge recess region disposed inset into an edge of the substrate, wherein the semiconductor laser chip is mounted adjacent to the edge recess region;
   a wire bond pad positioned on the top surface of the substrate;
   a wire bond coupled to the semiconductor laser chip and the wire bond pad; and
   an encapsulation covering the semiconductor laser chip, the edge recess region, the wire bond, and at least a portion of the top surface of the substrate, wherein the encapsulation is a molding compound.

2. The laminate leadless carrier package of claim 1, wherein the semiconductor laser chip is an edge emitting laser.

3. The laminate leadless carrier package of claim 2, wherein the laminate leadless carrier package is arranged to be mounted in a side-looker configuration on a printed circuit board, wherein the active area of the semiconductor laser chip is perpendicular to the printed circuit board.

4. The laminate leadless carrier package of claim 2, wherein the laminate leadless carrier package is arranged to be mounted in a top-looker configuration on a printed circuit board, wherein the active area of the semiconductor laser chip is parallel to the printed circuit board.

5. The laminate leadless carrier package of claim 1, wherein the plurality of conductive and dielectric layers comprise a bottom conductive layer, a top conductive layer, and a dielectric layer between the top and bottom conductive layers.

6. The laminate leadless carrier package of claim 5, further comprising a plurality of conductive vias providing electrical connections and thermal conduits between the top conductive layer and the bottom conductive layer.

7. The laminate leadless carrier package of claim 1, wherein the molding compound is optically transparent.

8. A laminate leadless carrier package, comprising:

a semiconductor laser chip;

a substrate supporting the semiconductor laser chip, the substrate comprising a plurality of conductive and dielectric layers laminated together, and an edge recess region disposed within a recess in an edge of the substrate, wherein the semiconductor laser chip is mounted adjacent to the edge recess region;

a wire bond pad positioned on the top surface of the substrate;

a wire bond coupled to the optoelectronic chip and the wire bond pad; and an encapsulation covering the optoelectronic chip, the wire bond, and at least a portion of the top surface of the substrate, wherein the encapsulation is a molding compound, wherein the laminate leadless carrier package is arranged to be mounted in a configuration from the group consisting of a side-looker configuration on a printed circuit board, wherein the active area of the optoelectronic chip is perpendicular to the printed circuit board, and a top-looker configuration on a printed circuit board, wherein the active area of the optoelectronic chip is parallel to the printed circuit board.

* * * * *